United States Patent

[11] 3,569,958

[72] Inventor Claude D. Gabriel
King of Prussia, Pa.

[21] Appl. No. 495,634
[22] Filed Oct. 13, 1965
[45] Patented Mar. 9, 1971
[73] Assignee Burroughs Corporation
Detroit, Mich.

[54] POLAR-TO-CARTESIAN, DIGITAL-TO-ANALOG CONVERTER
8 Claims, 9 Drawing Figs.

[52] U.S. Cl. 340/347, 235/150.53
[51] Int. Cl. H03k 13/04
[50] Field of Search 340/347; 235/150.52, 150.53, 186, 189; 343/5 (DP), 6, 17, 17.1

[56] References Cited

UNITED STATES PATENTS

| | | | |
|---|---|---|---|
| 3,177,350 | 4/1965 | Abbott et al. | 235/150.52 |
| 3,267,265 | 8/1966 | Popodi et al. | 235/15X |
| 3,277,464 | 10/1966 | Naydan et al. | 340/347 |
| 3,325,805 | 6/1967 | Dorey | 340/347 |
| 3,380,028 | 4/1968 | Gustafson et al. | 343/6 |
| 2,656,102 | 10/1953 | Redheffer | 235/186 |
| 2,738,504 | 3/1956 | Gray | 340/347 |
| 2,976,527 | 3/1961 | Smith | 340/347 |
| 2,869,115 | 1/1959 | Doeleman | 340/347 |
| 2,986,727 | 5/1961 | Macklem | 340/347 |
| 2,993,202 | 7/1961 | Halonen | 340/347 |
| 3,102,258 | 8/1963 | Curry | 340/347 |
| 3,250,905 | 5/1966 | Schroeder | 235/150.53X |
| 3,067,940 | 12/1962 | Preston | 235/150.5 |

*Primary Examiner*—Maynard R. Wilbur
*Assistant Examiner*—Gary R. Edwards
*Attorney*—Kenneth L. Miller

ABSTRACT: The present disclosure describes a code converter which converts directly from polar digital information to cartesian analog information by continuously adjusting the resistances of a weighted-resistor binary ladder that performs the digital to analog conversion.

INVENTOR.
CLAUDE D. GABRIEL
BY
Francis A. Varallo
AGENT

PATENTED MAR 9 1971

3,569,958

SHEET 3 OF 4

INVENTOR.
CLAUDE D. GABRIEL

BY Francis A. Varallo
AGENT

INVENTOR.
CLAUDE D. GABRIEL
BY Francis A. Varallo
AGENT

POLAR-TO-CARTESIAN, DIGITAL-TO-ANALOG CONVERTER

CONVERTER

This invention relates to digital-to-analogue converters, and more particularly relates to a digital-to-analogue converter which is capable of performing a mathematical operation during the decoding process.

It is frequently desirable to obtain in analogue form a function of a variable from this variable as represented in digital form. A computer, for example, may compute a variable in polar digital form. If this variable is to be displayed on a cathode ray tube, it must be converted to cartesian analogue form. To do this, the information must be converted from digital-to-analogue form and the radius vector must be multiplied by the sine of the polar angle to find one cartesian coordinate and by the cosine of the polar angle to find the other cartesian coordinate.

If the digital polar information is converted to digital cartesian information, the computer must store sine and cosine functions and must perform an arithmetic calculation. After this, the digital cartesian form must be converted to analogue cartesian form. This requires extensive computer operations if the conversion is calculated, or large memory storage capacity if table lookup methods are employed. In either case the procedure is costly. On the other hand, when the digital polar code is converted to analogue polar form, rapid conversion from polar form to cartesian form is difficult. Servoresolvers are frequently too slow. Methods involving phase detection or time sampling frequently lack accuracy. Accordingly, it is an object of this invention to provide improved apparatus for converting polar digital signals to cartesian analogue signals.

It is a further object of this invention to provide uncomplicated apparatus for providing a function of a variable in analogue form from the variable coded in digital form and for obtaining this function of the variable at high speeds and with high accuracy.

It is a further object of this invention to provide computing apparatus with no moving parts and drift-free characteristics for obtaining cartesian analogue information for polar digital information.

In accordance with the above objects, the digital information representing the polar angle is first converted to an analogue signal representing the sine of the polar angle and to a signal representing the cosine of the polar angle. The radius vector is then converted to analogue form and multiplied by the sine of the polar angle and by the cosine of the polar angle to yield the Y and X cartesian coordinates respectively.

The digital representation of the polar angle is converted to an analogue signal representing the sine of the polar angle and another analogue signal representing the cosine of the polar angle by applying the digital information to a binary-weighted ladder, digital-to-analogue converter to obtain the digital-to-analogue conversion. At the same time the slope of the binary-weighted ladder is changed at discrete values of the polar angle to approximate the characteristics of the sine or cosine output. The slope of the binary-weighted ladder is changed by shunting the ladder with an appropriate impedance. The impedance is selected by logical circuitry controlled by the digital representation of the polar angle.

The radius vector is converted from digital-to-analogue form and is multiplied by the sine of the polar angle or the cosine of the polar angle by two six-bit weighted ladders. The multiplication is obtained in these ladders by using the sine of the polar angle or the cosine of the polar angle as the reference voltage applied to the ladders.

The invention and the above-noted and other features thereof will be understood more clearly and fully from the following detailed description with reference to the accompanying drawings in which.

Figure 1:
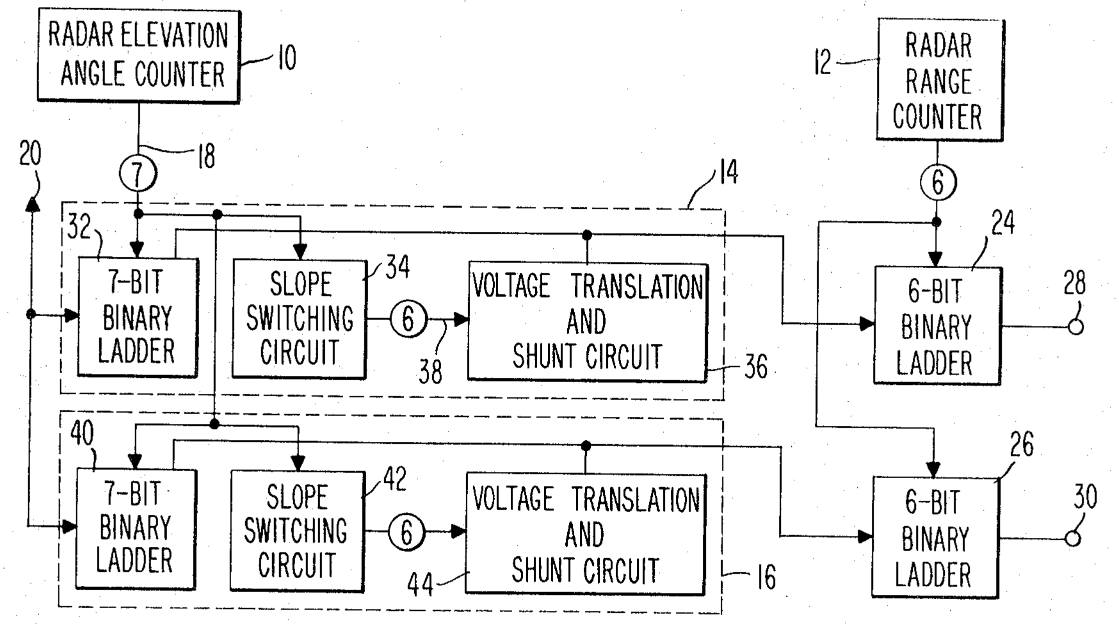
FIG. 1 is a simplified block diagram of an embodiment of the invention.

In FIG. 1, a block diagram of the polar digital-to-cartesian analogue converter is shown having a source 10 of digital information representing a polar angle with seven binary bits and having a source 12 representing a radius vector with six binary bits. The source of a binary representation of a polar angle may originate with the elevation angle counter for a height finding radar and may represent the angle from the horizontal of an object detected by the radar. The source of the binary representation of the radius vector 12 may be a range counter for a height finding radar and may represent the distance of a detected object from the radar set. The source of the polar angle 10 is electrically connected to a sine ladder shown generally at 14 and to a cosine ladder shown generally at 16 through the seven conductors 18 indicated by a single line labeled with a circle containing the number "7."

A source 20 of electrical potential which provides a stable reference voltage, is connected to both the sine ladder 14 and the cosine ladder 16. The output of the sine ladder 14 and of the radar range counter 12 are electrically connected to a 6-bit binary ladder 24 and the output of the cosine ladder 16 and the radar range counter 12 are electrically connected to a 6-bit binary ladder 26. The 6-bit binary ladder 24 provides the Y cartesian coordinate to output terminal 28 and the 6-bit binary ladder 26 provides the X cartesian coordinate to the output terminal 30.

Within the sine ladder 14 a 7-bit binary ladder 32 is electrically connected to the source of potential 20 and to the output of the radar azimuth counter 10. The binary ladder 32 converts the digital information from the elevation angle counter 10 to analogue information. A slope switching circuit 34 and a voltage translation and shunt circuit 36 are also part of the sine ladder 14. The slope switching circuit 34 is also electrically connected to the radar elevation angle counter 10 and decodes the digital output pulses from this counter to provide switching pulses to the voltage translation and shunt circuit 36 through the six lines 38. In response to these switching pulses, the voltage translation and shunt circuit 36 places a shunting impedance across the output of the binary ladder 32 and a voltage bias such that the voltage output is proportional to the sine of the polar angle provided in digital form by the radar elevation counter 10.

Within the cosine ladder 16 there is also a 7-bit binary ladder 40 which receives voltages from the source 20 and receives digital information from the radar elevation angle counter 10. Also, within the cosine ladder are a slope switching circuit 42 and a current generator and shunt circuit 44. The slope switching circuit 42 receives digital information from the radar elevation angle counter 10 and decodes the information to provide controlling switching pulses to the voltage translation and shunt circuit 44. The current generator and shunt circuit places an impedance in shunt across the output of the binary ladder 40 along with a voltage translator.

This impedance alters the voltage output from the binary ladder 40 so that it represents the cosine of the polar angle represented in digital form by the output from the radar elevation angle counter 10.

The 6-bit binary ladder 24 multiplies the analogue voltage representing the sine of the polar angle as received from the sine ladder 14 by an analogue voltage representing the radius vector which it obtains in digital form from the radar range counter 12 and provides this product to the output terminal 28. The 6-bit binary ladder 26 multiplies the analogue voltage which represents the cosine of the polar angle received from the cosine ladder 16 by the analogue voltage representing the radius vector which it receives in digital form from the radar range counter 12 and provides this product to the output terminal 30.

Figures 2, 3:
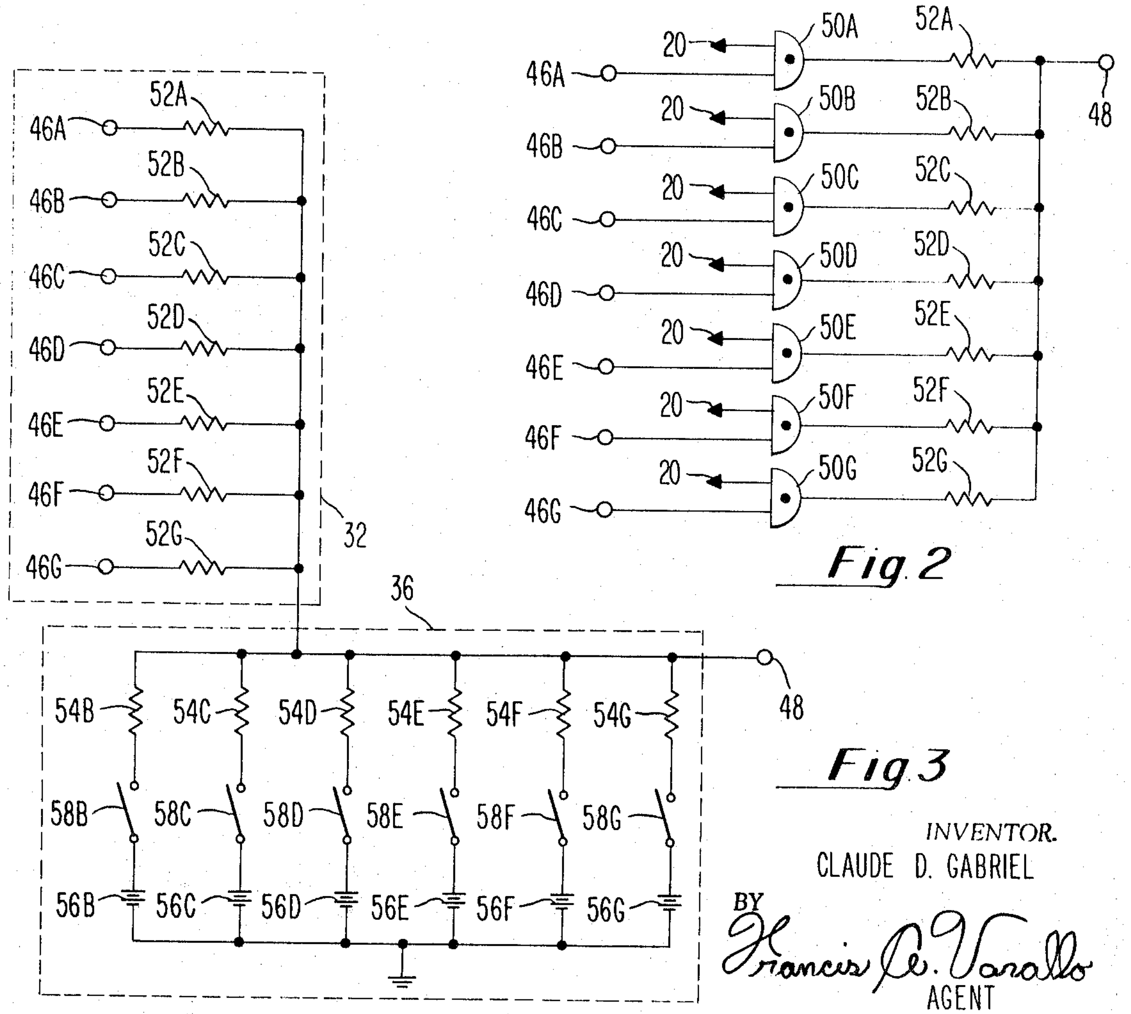
FIG. 2 is a schematic circuit diagram of a weighted resistor ladder for digital-to-analogue conversion which may be used in the embodiment of FIG. 1.
FIG. 3 is a simplified schematic circuit diagram of an adjustable binary-weighted ladder suitable for converting a binary representation of a polar angle into an analogue representation of the sine of the angle, such as may be used in the embodiment of the invention.

In FIG. 2, a simple weighted-resistor binary ladder is shown having seven input terminals 46A—46G for receiving the seven bits of digital information from the radar elevation angle counter 10 and having output terminal 48 for providing an analogue representation of the digital signal received on the input terminals 46A—46G. Each of the input terminals 46A—46G is connected to a different one of the gates 50A—50G. A source of reference voltage 20 is also electrically connected to each of the gates 50A—50G. The output of each of the gates 50A—50G is electrically connected to a different one of the resistors 52A—52G. The opposite end of each of the resistors 52A—52G is electrically connected to the output terminal 48. The resistor 52G has twice the resistance of the resistor 52F; the resistor 52F has twice the resistance as the resistor 52E; the resistor 52E has twice the resistance as the resistor 52D; the resistor 52D has twice the resistance as the resistor 52C; the resistor 52C has twice the resistance as the resistor 52B; and the resistor 52B has twice the resistance as the resistor 52A.

When an input pulse is applied to one of the input terminals 46A—46G, the corresponding gate is opened so as to apply the reference voltage 20 to the output terminal 48 through the corresponding resistor. This provides a linear conversion of the binary digital information coming into the terminals 46A—46G to an analogue output voltage appearing at the output terminal 48. While a simplified weighted resistor converter has been disclosed in FIG. 2, it is clear that many other kinds of digital-to-analogue converters may be used such as those disclosed between pages 5—29 and 5—51 of Analogue-Digital Conversion Techniques, by Alfred K. Susskind, the Technology Press, Massachusetts Institute of Technology, 1957.

Since the binary ladder 32 provides a linear analogue representation of the digital input information, it is necessary to modify this output to cause it to conform to the desired function. In this case, the input is a polar angle and it is desired to modify the analogue representation of this polar angle so that the output voltage is an analogue representation of the sine of the polar angle. This modification of the output voltage is also controlled by the digital information from the radar elevation angle counter 10. The computation is made by changing the slope of the binary ladder and adding a bias voltage to cause it to conform to a since function in response to the digital information from the radar azimuth counter 10. To change the slope of the binary ladder 32, it is necessary either to change the input voltage 20, to change all of the resistors 52A—52G, or to shunt the ladder itself with an appropriate impedance. The last approach is illustrated in the embodiment of FIG. 1.

Figure 4:
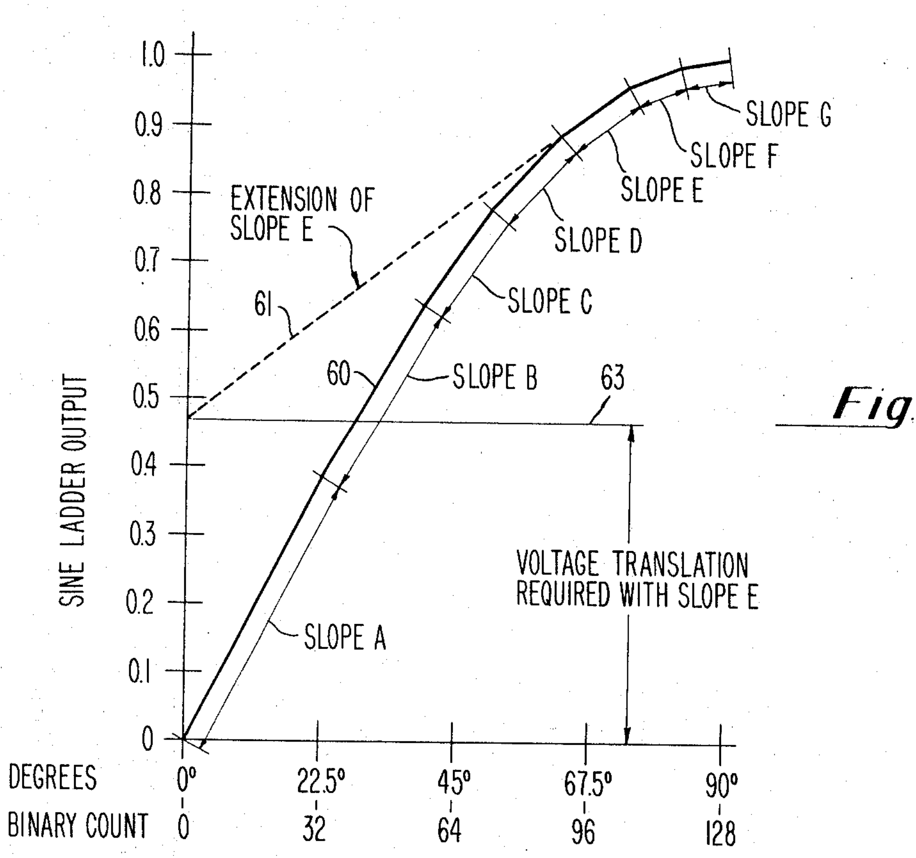
FIG. 4 is a graph illustrating the manner in which the circuit of FIG. 3 approximates a sine function.

The slope is changed or switched in discrete increments or degrees of angular spread. The outputs of the ladder are linear between the points of slope switching, thus providing a sine wave approximation. FIG. 4 illustrates this approximation by depicting seven slopes designated A through G which yield a maximum error of 0.3 percent due to such approximation. Such performance is considered completely satisfactory in cases where the input to the converter is a 7-bit polar angle having a least significant bit representing a change of 0.8 percent.

In FIG. 3, a simplified equivalent circuit diagram of the voltage translation and shunt circuit 36 is shown electrically connected to the binary ladder 32. This voltage translation and shunt circuit connects the appropriate impedance in parallel with the output terminal 48 of the binary ladder 32 to modify the output voltage characteristic into the form of a sine in response to switching from the slope switching circuit 34 (FIG. 1) which is controlled by the digital information from the radar elevation angle counter 10 (FIG. 1).

In FIG. 3, each of the six resistors 54B—54G has one end electrically connected to the output terminal 48 of the binary ladder 32. The other end of each of the resistors 54B—54G is electrically connected to a corresponding one of the voltage translation sources 56B—56G through a corresponding switch 58B—58G.

Figure 8:
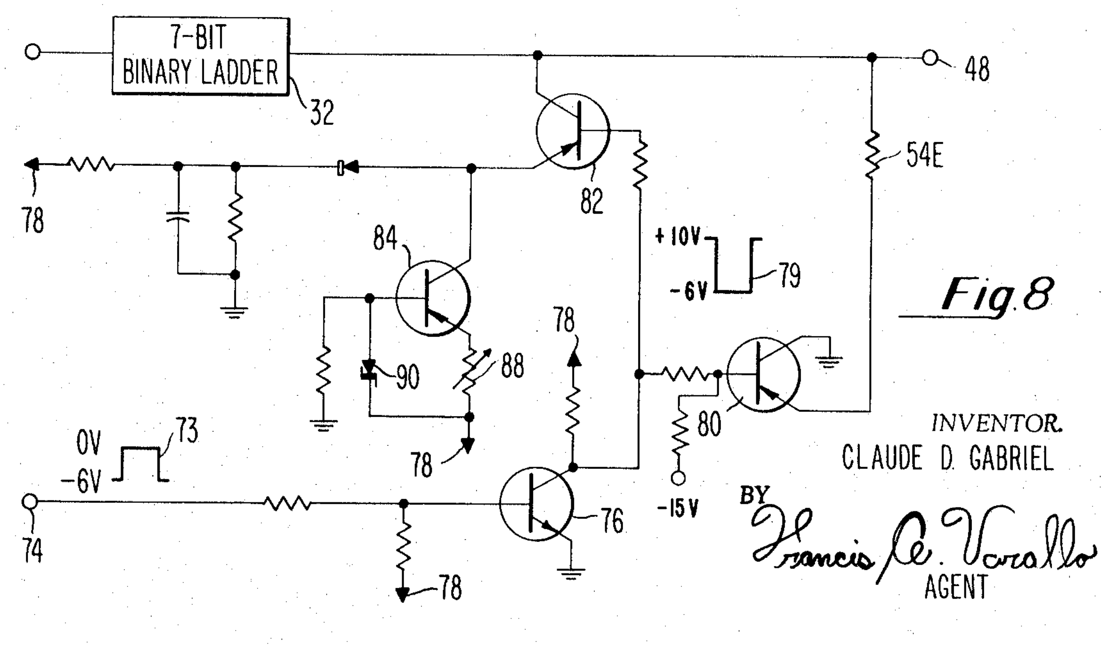
FIG. 8 is a schematic circuit diagram of a shunt switching and voltage translation generator which may be utilized with the binary ladder shown in FIG. 3.

The resistors are of proper value to shunt the ladder to produce the desired slopes and the voltage sources provide the bias potentials for the required voltage translations. The slope switching circuit 34 controls switches 58B—58G. The circuit diagram of FIG. 8 shows a transistor circuit capable of providing the switching, shunting and voltage translation required for the equivalent circuit of FIG. 3. The latter circuit provides the Norton equivalent shunt resistance and current of any of the voltage, switch and resistor groups designated 56B, 58B, 54B through 56G, 58G, 54G. Norton equivalents are employed because it is easier to provide bias currents rather than bias voltages when using solid-state circuits.

In FIG. 4, a graph 60 of a sine wave is shown having ordinates indicating the value of a sine of the polar angle and having abscissas indicating the value of the polar angle in degrees in a top column and the digital count which represents the polar angle from the radar azimuth counter 10 in a bottom column. The sine wave 60 is divided into seven sections, each of which is represented by a different straight line having a slope which approximates the sine wave in the same section.

The binary ladder 32 has a slope indicated as slope A. When the digital count from the radar azimuth counter 10 is between 0 and 32, representing a polar angle of between 0° and 22½°, all of the switches 58B—58G are open so that the binary ladder 32 is not shunted and provides a linear approximation in analogue form of the sine of the angle which is received on its input terminals 46A—46G in digital form. When the digital count of the radar elevation angle counter 10 is between 32 and 64, indicating a polar angle of between 22½° to 39.375°, the switch 58B is closed by the slope switching circuit 34 so as to shunt the output from the binary ladder 32 in the resistance 54B. This alters the slope of the binary ladder to that shown as slope B on curve 60 and the binary ladder provides an output voltage which is a linear approximation of the sine of the angle in that range. The same process occurs when the polar angle falls into any of the other five ranges into which the sine curve has been broken.

Figure 5:
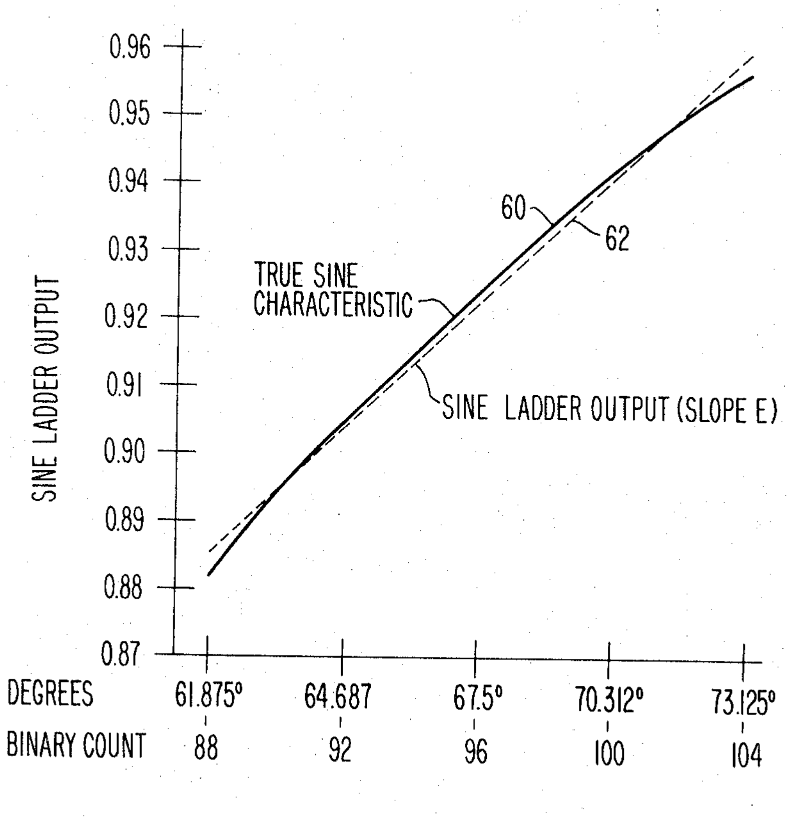
FIG. 5 is an expanded section of the graph shown in FIG. 4.

The form of this approximation is shown more clearly in FIG. 5, which represents the range indicated as slope E in FIG. 4. In FIG. 5 the curve 60 represents the portion of the sine wave between 61.875 and 73.125° and the straight line 62 is the approximation provided by the sine ladder 14.

The slope of the straight line in each range can be obtained by dividing the difference between the sines of the angle at the extremes of the range by the difference between the maximum and minimum digital counts of the range and by multiplying this quotient by the total number of digital counts, which is 128 in our example. The shunt resistance required to obtain this slope may be calculated by finding the total resistance of the binary ladder which is equal to the resistance of resistor 52A divided by two and by calculating the resistance which, when shunted across the resistance of the binary ladder having an input proportional to the normal slope of the ladder (unshunted), will equal an output proportional to the slope of the section being calculated. A voltage is applied through the shunting resistor if an output voltage translation is needed to obtain the proper slope. For example, the magnitude of the voltage translation required by slope E is shown by line 63 in FIG. 4.

The following calculations for shunt resistance, voltage translation and Norton equivalents of current are detailed for slopes A and B.

I Slope A 0° to 22.5°

Sin Θ = 0 = Count 0

Sin 22½ = .38268 = Count 32

The error is set to +0.3 percent at 22½° and therefore the ladder must reach value of Sin 22½° + .003 at 22½° or the ladder output at 22½° = .38268 + .003 = .38568

$$\text{Slope} = \frac{(.38568-0)\times\text{Maximum Binary Count}}{\text{Binary Count Spread}}$$

$$= \frac{.38568-0\times128}{32-0} = 1.540$$

To obtain this slope the reference voltage input from source 20 applied to the ladder shown in FIG. 2 is set to 1.54 times the voltage desired out of the ladder when Sin Θ is equal to 1, that is, Θ = 90°. For example, assuming that an output voltage of 1.0 volt is desired at terminal 48 of the ladder, the reference input voltage would be chosen at 1.54 volts.

In accordance with the latter example, the weight of each bit of the ladder in volts, *v.*, for slope A = 1.540 is:

46A = .7700v.
46B = .3850v.
46C = .1925v.
46D = .0962v.
46E = .0481v.
46F = .0241v.
46G = .0120v.

II Slope B 22.5° to 39.375°

Sin 22.5° = .38268 = Count 32

Sin 39.375° = .63439 = Count 56

$$\text{Slope} = \frac{(.63439-.38268)\times128}{56-32} = 1.340$$

Considering a shunt resistor $R_X$ connected from the output terminal 48 of the ladder shown in FIGS. 2 and 3, the value of $R_X$ (referenced to R, the resistance of resistor 52A) required to obtain this slope is calculated as follows:

$$\frac{V_{in}}{E_0} = \frac{R/2+R_X}{R_X}$$

where $V_{in}$ is the reference input voltage of source 20 (FIG. 2) and $E_o$ is the output voltage at terminal 48 (FIGS. 2 and 3). Thus for slope B, $R_X$, the value of shunt resistor 54B is computed as:

$$\frac{1.54V}{1.34V} = \frac{R/2+R_X}{R_X}$$

$$R_X = \frac{\frac{1.34}{1.54}\times R/2}{1-\frac{1.34}{1.54}} = 3.349R$$

In comparison with the bit weights for slope A given hereinbefore, the weight of each of the bits of the ladder in volts, *v.*, for slope B = 1.340 is:

46A = .6700v.
46B = .3350v.
46C = .1675v.
46D = .0837v.
46E = .419v.
46F = .0209v.
46G = .0105v.

Figure 6A:
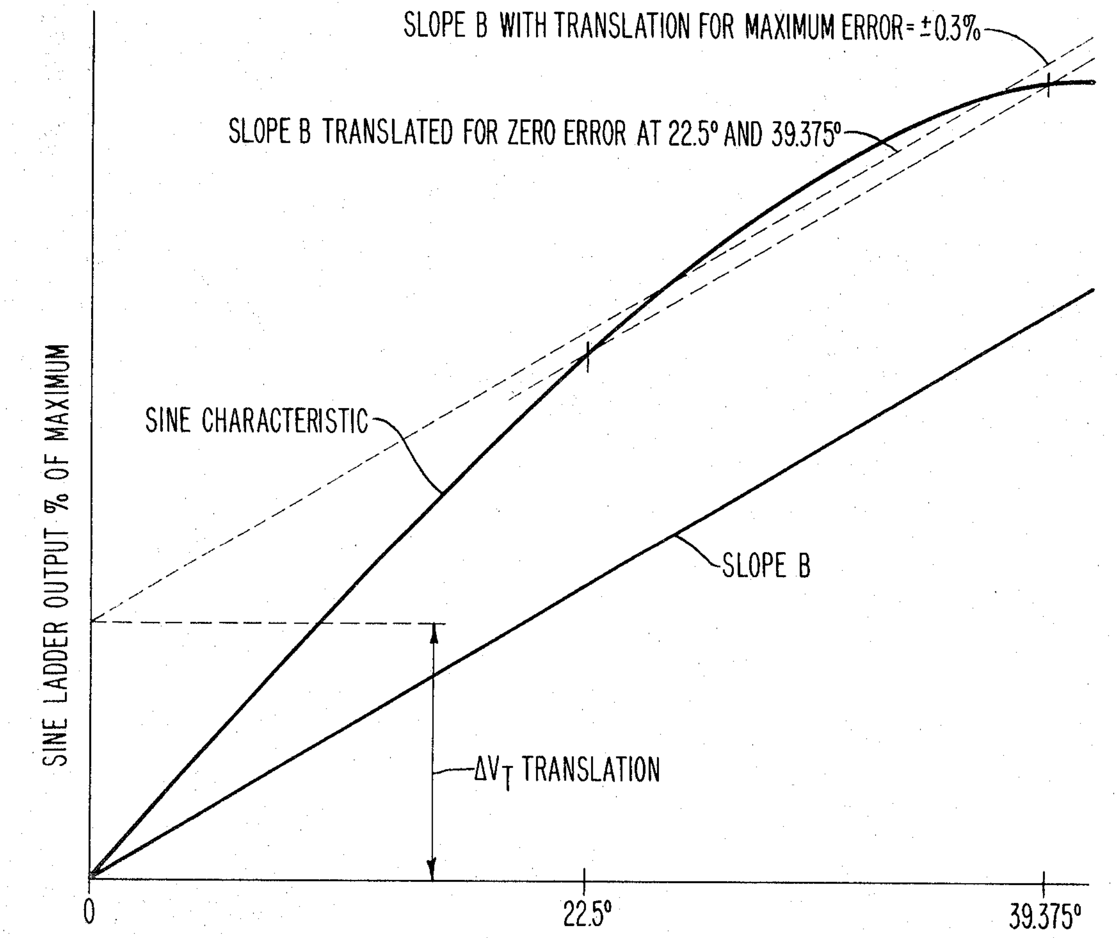
FIG. 6A is a graph illustrating the mode of designing a binary-weighted ladder in accordance with the present invention.

Since the count at 22½° is 0100000, the 46B bit is the only one contributing to an output. The resultant ladder output is .3350v. This indicates that a voltage translation of .38268v. − .3350v. is necessary to have zero error at 22½° and 39.375°; however, the curve is shifted as shown in FIG. 6A by adding .003v. Therefore, the voltage translation, $\Delta V_T$ is $\Delta V_T$ = Sin 22½° + .003v. − ladder output at 22.5°

$\Delta V_T$ = .38268v. + .003v. − .3350v. = .0507v.

Figure 6B:
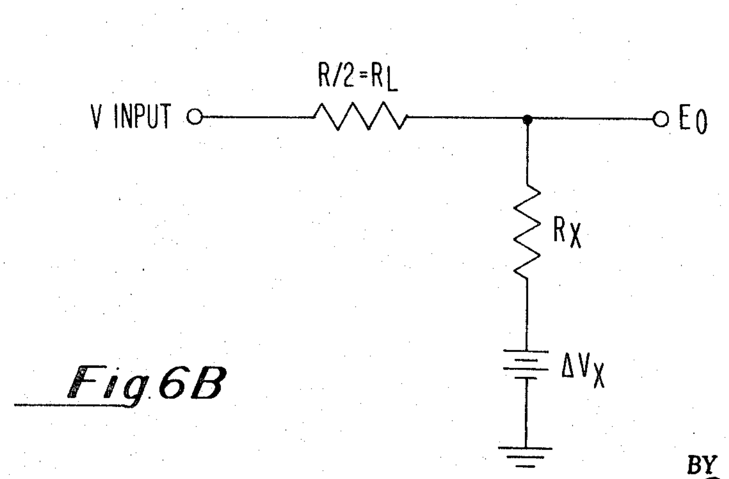
FIG. 6B is an equivalent circuit of the ladder having the characteristics illustrated by the graph of FIG. 6A.

The equivalent circuit of the ladder having the characteristics depicted in FIG. 6A is shown in FIG. 6B.

It is desired to have $$E_0 = 1.54V\left(\frac{R_X}{R_L+R_X}\right)+\Delta V_T$$

where $R_X$ is the shunt resistance and $R_L$ is the resistance of the binary ladder, and $\Delta V_T$ is the voltage translation required. However, if one were to make $\Delta V_X$ of FIG. 6B equal to $\Delta V_T$, the output of the ladder $E_o$ becomes:

$$E_0 = (1.54V-\Delta V_T)\left(\frac{R_X}{R_L+R_X}\right)+\Delta V_T$$

$$= 1.54V\frac{R_X}{R_L+R_X} - \frac{\Delta V_T R_X}{R_L+R_X} + \Delta V_T$$

$$= 1.54V\frac{R_X}{R_L+R_X} - \Delta V_T\frac{(R_X-R_L-R_X)}{R_L+R_X}$$

$$= 1.54V\frac{R_X}{R_L+R_X} + \Delta V_T\left(\frac{R_L}{R_L+R_X}\right)$$

Multiplying the right-hand member of the last equation by $$\frac{R_L+R_X}{R_L}$$

forces the desired solution, namely $$E_0 = 1.54V\left(\frac{R_X}{R_L+R_X}\right)+\Delta V_T$$

The forcing of the solution can easily be accomplished by utilizing a voltage $\Delta V_X$ in the equivalent circuit of FIG. 6B which is equal to:

$$\Delta V_X = \Delta V_T\left(\frac{R_L+R_X}{R_L}\right)$$

For the solution of slope B for this example:

$$\Delta V_X = \Delta V_T\frac{R/2+3.349R}{R/2}$$

$\Delta V_X$ = .0507V(1 + 6.698) = .390v.

The Norton equivalent of $\Delta V_X$ and $R_X$ are used to obtain the Norton equivalent current I, thus $$I = \frac{\Delta V_X}{R_X} = \frac{.3903V}{3.349R} = .1165\frac{V}{R}$$

Similarly the shunt resistors, voltage translation and Norton current equivalents are calculated for slopes C through G.

The cosine ladder is the complement of the sine ladder. Cos Θ = Sin of (90°−Θ). The binary ladder receives the complement (zero side of flip-flops) of the radar elevation count as an input. All other functions remain the same as described for the sine ladder.

The boolean expression for controlling the switching of the switches 58B—58G and the corresponding slope of the binary ladder are given below in tabular form. The currents given in the next to the last column are those required for a ladder in which resistor 52A is 10 kilo-ohms and source 20 provides 8 volts. The values of the shunt resistances required to produce the various slopes, referenced to R, the resistance of resistor 52A, are listed in the last column.

TABLE I

| Slope No. | Degree spread From— | Degree spread To— | Binary count spread From— | Binary count spread To— | Boolean expression for decoding | Slope | $\Delta V_T$ | I equiv., ma. | R shunt ($R_X$) |
|---|---|---|---|---|---|---|---|---|---|
| A | 0 | 22½ | 0 | 31 | $\overline{W}_7 \cdot \overline{W}_6 \cdot \overline{W}_5 + \overline{W}_7 \cdot \overline{W}_6 \cdot W_5$ | 1.540 | OV | 0 | ∞ |
| B | 22½ | 39.375 | 32 | 55 | $\overline{W}_7 \cdot W_6 \cdot \overline{W}_5 + \overline{W}_7 \cdot W_6 \cdot W_5 \cdot \overline{W}_4$ | 1.340 | .0507V | .0605 | 3.349R |
| C | 39.375 | 50.625 | 56 | 71 | $\overline{W}_7 \cdot W_6 \cdot W_5 \cdot W_4 + W_7 \cdot \overline{W}_6 \cdot \overline{W}_5 \cdot \overline{W}_4$ | 1.110 | .1510V | .2177 | 1.290R |
| D | 50.625 | 61.875 | 72 | 87 | $W_7 \cdot \overline{W}_6 \cdot \overline{W}_5 \cdot W_4 + W_7 \cdot \overline{W}_6 \cdot W_5 \cdot \overline{W}_4$ | .871 | .2885V | .5243 | 0.651R |
| E | 61.875 | 73.125 | 88 | 103 | $W_7 \cdot \overline{W}_6 \cdot W_5 \cdot W_4 + W_7 \cdot W_6 \cdot \overline{W}_5 \cdot \overline{W}_4$ | .600 | .4724V | 1.036 | 0.3291R |
| F | 73.125 | 81.562 | 104 | 115 | $W_7 \cdot W_6 \cdot \overline{W}_5 \cdot W_4 + W_7 \cdot W_6 \cdot W_5 \cdot \overline{W}_4 \cdot \overline{W}_3$ | .3448 | .6798V | 2.997 | 0.1440R |
| G | 81.562 | 90 | 116 | 127 | $W_7 \cdot W_6 \cdot W_5 \cdot \overline{W}_4 \cdot W_3 + W_7 \cdot W_6 \cdot W_5 \cdot W_4$ | .1148 | .8878V | 12.39 | 0.04028R |

Figure 7:
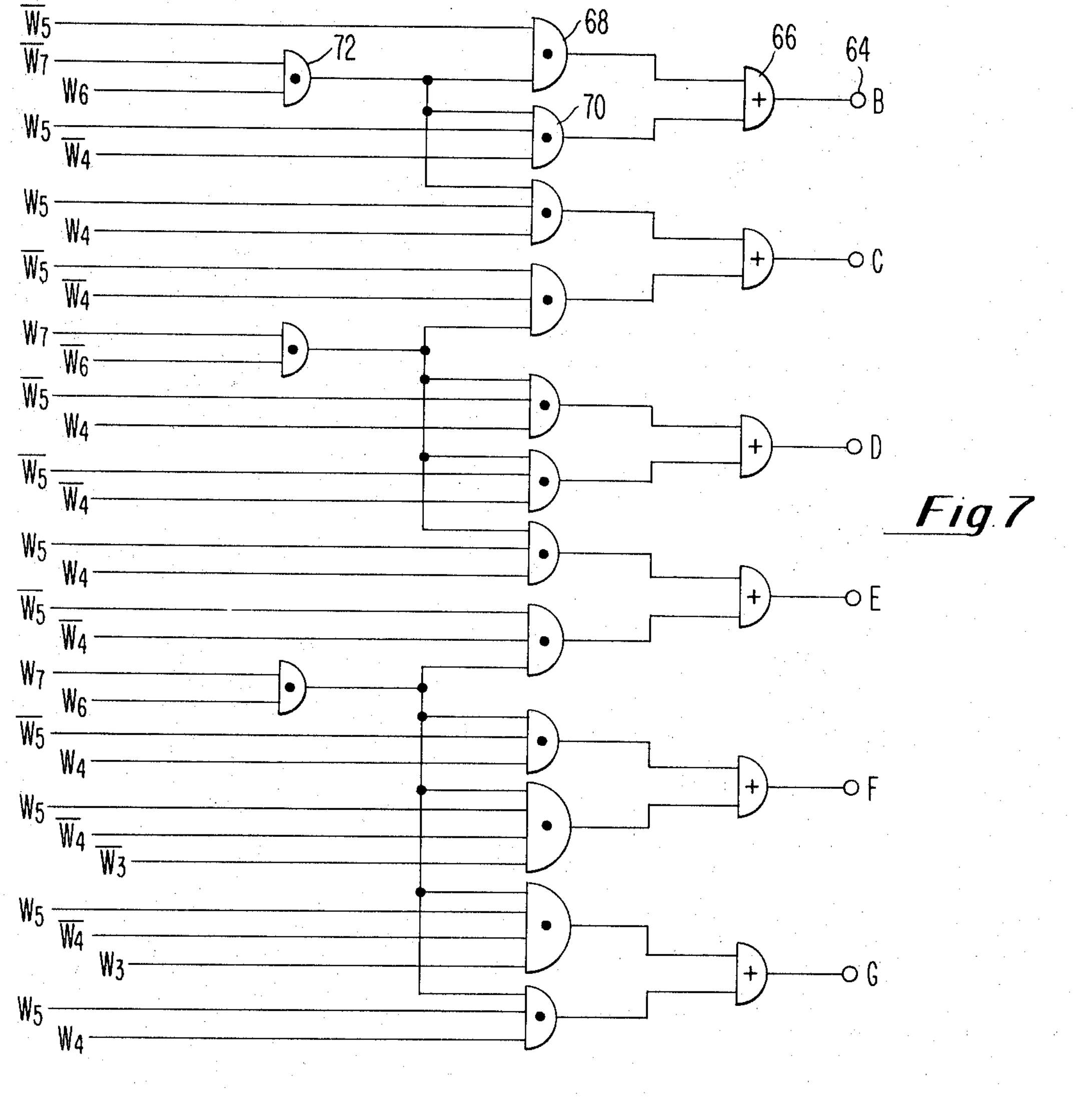
FIG. 7 is a logic diagram of the slope switching circuit used in the embodiment of the invention shown in FIG. 1.

In FIG. 7 the logic diagram for the slope switching circuit 34 is provided having the digital inputs indicated by a W with a subscript. The subscript indicates the order of the bit ranging from 1 to 7. For example, a pulse is provided at B terminal 64 whenever a signal is received by OR gate 66. OR gate 66 may receive a signal from either the AND gate 68 or the AND gate 70. Both the AND gate 68 and the AND gate 70 must receive a pulse from the AND gate 72 indicating that the gate 72 has received the six order bit and not received a seventh order bit. Once this condition is fulfilled, the AND gate 68 provides an output pulse if it does not receive a fifth order bit and the AND gate 70 provides an output pulse if it does not receive a fourth order bit but does receive a fifth order it. This provides that an output pulse will occur at terminal 64 at any time that there is a count between 32 and 55 from the radar azimuth counter 10.

In FIG. 8 a current generator for supplying the Norton equivalent current of voltage translation and a shunt circuit are shown. The input voltage is passed through the binary ladder 32 to the output terminal 48. When an input voltage pulse 73 is applied to terminal 74 by the slope switching circuit 34, the NPN transistor 76 is driven into conduction drawing current from a source of positive 20 volts, designated 78, to ground and biasing the PNP transistors 80 and 82 into conduction with a pulse 79. When the transistor 80 is driven into conduction, the shunting resistor which is shown as 54E is connected between the output 48 and ground through the transistor 80 and a source of current is connected to the output 48 through the transistor 82 and the transistor 84 from the source of a positive 20 volts, 78. The current is regulated to 1.036 milliamperes by the resistor 88 which is connected between the emitter of PNP transistor 84 and the source 78 and by the Zener diode 90 which has its cathode electrically connected to the source 78 of a positive 20v. and has its anode electrically connected to the base of the transistor 84.

Of course, six current generator and shunt circuits would be required for the sine ladder 14 and six for the cosine ladder 16. The slope switching circuit 42 could be identical to the slope switching circuit 34 providing it was fed complementary digital bits from the radar azimuth counter 10, or in the alternative, the resistances could be computed as demonstrated with the slope switching circuit 34 to provide the cosine function rather than the sine function. The 6-bit binary ladders 24 and 26 may be constructed in the same manner as the ladder shown in FIG. 2, but having only the first six weighted resistors.

It can be seen that the polar-digital to caresian-analogue converter disclosed is simple and economical. Its speed of operation is only limited to that of the speed of transistor devices; there being no resolvers or moving parts. Because of its speed of operation, it has the ability to handle random inputs very rapidly. There is very little drift involved.

Obviously, many modifications and variations of the present invention are possible in the light of the above teachings. It is therefore to be understood that within the scope of the appended claims the invention may be practiced otherwise than as specifically described.

I claim:

1. The combination comprising:

input terminal means for receiving a digital signal that is representative of the value of an input variable quantity;

an output terminal;

digital-to-analogue converter means electrically connected to said output terminal and having a plurality of controls for selectively providing to said output terminal a voltage, the amplitude of which is proportional to a predetermined function of a different value of said input variable for each different combination of said plurality of controls that is activated;

circuit means electrically connected to said input terminal means and to said digital-to-analogue converter means for activating that combination of controls that causes said digital-to-analogue converter means to provide a voltage having an amplitude proportional to said predetermined function of the value of said input variable quantity;

said digital-to-analogue converter means comprising linear means electrically connected to said input terminal means and to said output terminal for generating a voltage which is proportional in amplitude to the value represented by said digital signal received by said input terminal means; and shunting means including said plurality of controls and being electrically connected to said linear means and to said input terminal means for changing the amplitude of the voltage output from said linear means to conform it to a predetermined function of said digital signal received by said input terminal means.

2. The combination according to claim 1 in which said shunting means comprises:

a plurality of impedances having different values;

a plurality of switches electrically connected to said plurality of impedances and to corresponding sources of voltage potential; and logical switching means electrically connected to said input terminal means and to said plurality of switches, for selectively closing those switches which will place an impedance and voltage potential between said output terminal and ground that will alter the amplitude and provide a voltage translation of said voltage output from said linear means to cause it to conform to a predetermined function as determined by said logical means.

3. The combination according to claim 2 in which said linear means comprises a binary weighted-resistor ladder digital-to-analogue converter.

4. Apparatus as defined in claim 1 for converting a digital representation of an angle into an analogue representation of a trigonometric function of the angle wherein:

said input terminal means receives said digital representation of said angles;

said linear means generating a voltage which is proportional in amplitude to the value of said digital representation of said angle received by said input terminal means; and said shunting means changing the amplitude of the output voltage from said linear means appearing on said output terminal to conform it to said analogue representation of the trigonometric function of said angle.

5. Apparatus for converting a digital signal which represents an angle to an analogue signal representing a predetermined trigonometric function of said angle according to claim 4 in which said linear means is a binary ladder.

6. Apparatus for converting a digital signal which represents an angle to an analogue signal which represents a predetermined trigonometric function of the angle according to claim 5 in which said shunting means comprises a means for electrically connecting an impedance and voltage potential between said output terminal and a reference potential so as to alter said linear means output voltage to cause it to conform to the slope of the curve of the trigonometric function of said angle and to provide the required voltage translation to approximate the trigonometric function.

7. Apparatus for converting digital polar information to analogue cartesian information, comprising:

a first input terminal adapted to receive digital information representative of the polar angle;

a second input terminal adapted to receive digital information representative of a radius vector;

an X output terminal adapted to provide analogue abscissa information;

a Y output terminal adapted to provide ordinate analogue information;

a first binary ladder electrically connected to said first input terminal;

a second binary ladder electrically connected to said first input terminal;

first switching means electrically connected to said first input terminal and to said first binary ladder for changing the slope of the output voltage from said first binary ladder to cause it to approximate the sine of said polar angle;

second switching means electrically connected to said first input terminal and to said second binary ladder for changing the slope of the output voltage from said binary ladder to cause it to approximate the cosine of said polar angle;

third binary ladder means having an input electrically connected to said second input terminal and a second input electrically connected to the output from said first switching means and having its output connected to said Y output terminal for converting said digital representation of said radius vector to an analogue value and multiplying it by the output from said first switching means; and a fourth binary ladder means having a first input electrically connected to said second input terminal and a second input electrically connected to the output from said second switching means and having its output electrically connected to said X output terminal, for converting said digital representation of said radius vector to an analogue value and multiplying said analogue value by the output from said second switching means.

8. Apparatus for converting digital polar information to analogue cartesian information according to claim 7 in which said first switching means comprises a plurality of impedances and corresponding voltage sources; each impedance of said plurality of impedances being capable of changing the slope of said first binary ladder and each corresponding voltage source providing a voltage translation so as to approximate the slope of a different portion of a sine function; and decoding means electrically connected to said first input terminal and to said plurality of impedances for electrically connecting that one of said plurality of impedances and corresponding voltage sources in shunt with said first binary ladder which cause the slope of said first binary ladder to correspond to the slope of the sine of the polar angle represented by said digital signal being received on said first input terminal.